United States Patent

Siebens

(10) Patent No.: US 9,437,374 B2
(45) Date of Patent: Sep. 6, 2016

(54) AUTOMATED GROUNDING DEVICE WITH VISUAL INDICATION

(71) Applicant: Thomas & Betts International, Inc., Wilmington, DE (US)

(72) Inventor: Larry N. Siebens, Asbury, NJ (US)

(73) Assignee: Thomas & Betts International LLC DE (US)

( * ) Notice: Subject to any disclaimer, the term of this patent is extended or adjusted under 35 U.S.C. 154(b) by 143 days.

(21) Appl. No.: 14/242,978

(22) Filed: Apr. 2, 2014

(65) Prior Publication Data

US 2014/0346023 A1 Nov. 27, 2014

Related U.S. Application Data

(60) Provisional application No. 61/827,381, filed on May 24, 2013.

(51) Int. Cl.
*H01H 9/12* (2006.01)
*H01H 31/00* (2006.01)
*H01H 9/16* (2006.01)
*H01R 13/53* (2006.01)
*H01H 9/02* (2006.01)
*H01R 31/02* (2006.01)

(52) U.S. Cl.
CPC ............ *H01H 9/12* (2013.01); *H01H 9/16* (2013.01); *H01H 31/003* (2013.01); *H01R 13/53* (2013.01); *H01H 2009/0292* (2013.01); *H01R 31/02* (2013.01); *Y10T 29/49105* (2015.01)

(58) Field of Classification Search
CPC ........ H01H 9/12; H01H 15/00; G01R 31/04; H01R 4/28

USPC ............................. 200/48 R, 16 D; 439/775
See application file for complete search history.

(56) References Cited

U.S. PATENT DOCUMENTS

| 3,233,069 A | 2/1966 | Date |
| 4,513,208 A | 4/1985 | Kamata |
| 4,804,809 A | 2/1989 | Thompson, Jr. et al. |
| 4,956,742 A * | 9/1990 | Takagi ................. H02B 13/055 218/98 |

(Continued)

FOREIGN PATENT DOCUMENTS

| CA | 2003844 A1 | 10/1993 |
| CA | 2022949 A1 | 10/1993 |

(Continued)

*Primary Examiner* — Edwin A. Leon
*Assistant Examiner* — Iman Malakooti
(74) *Attorney, Agent, or Firm* — Taft Stettinius & Hollister LLP

(57) ABSTRACT

A grounding device for switchgear includes a connector and a body. The body includes (1) a male interface portion including an electrically conductive bus with a first bore and a spade connector; (2) a conductive housing including a second bore that is axially aligned with the first bore, and a grounding terminal to receive a grounding wire; (3) a pin assembly including a non-conductive tip, and a conductive pin, wherein the pin assembly is configured to move axially within the first and second bores between a closed position that provides an electrical connection between the bus and the conductive housing and an open position that provides no electrical connection; (4) a communications receptacle to receive signals from a controller outside the device body; and (5) a motor configured to selectively drive the pin assembly between the open position and the closed position, based on a signal from the controller.

20 Claims, 7 Drawing Sheets

(56) References Cited

U.S. PATENT DOCUMENTS

| | | |
|---|---|---|
| 5,025,171 A | 6/1991 | Fanta et al. |
| 5,254,814 A | 10/1993 | Harr |
| 5,311,161 A | 5/1994 | Calder et al. |
| 5,457,292 A | 10/1995 | Harr |
| 5,667,060 A | 9/1997 | Luzzi |
| 5,834,909 A | 11/1998 | Marmonier |
| 6,396,018 B1 | 5/2002 | Kinoshita et al. |
| 6,797,909 B2 | 9/2004 | Pride et al. |
| 6,818,850 B2 | 11/2004 | Bridges |
| 6,927,355 B2 | 8/2005 | Thuresson et al. |
| 7,009,130 B2 | 3/2006 | Hashimoto et al. |
| 7,432,787 B2 | 10/2008 | Muench et al. |
| 7,479,612 B2 | 1/2009 | Waldi et al. |
| 7,630,189 B2 | 12/2009 | Lalonge |
| 8,115,134 B2 | 2/2012 | Yanase et al. |
| 8,139,345 B2 | 3/2012 | Christensen et al. |
| 8,368,405 B2 | 2/2013 | Siebens |
| 2002/0088775 A1 | 7/2002 | Bridges |
| 2004/0042158 A1 | 3/2004 | Otsuka et al. |
| 2005/0189325 A1 | 9/2005 | Schweizer et al. |
| 2006/0011589 A1 | 1/2006 | Hering et al. |
| 2006/0266630 A1* | 11/2006 | Stepniak ............... H01H 33/02 200/16 D |
| 2010/0046146 A1 | 2/2010 | Christensen et al. |
| 2011/0025342 A1 | 2/2011 | Siebens |
| 2012/0028510 A1 | 2/2012 | Borgstrom et al. |

FOREIGN PATENT DOCUMENTS

| | | |
|---|---|---|
| CA | 2715849 A1 | 9/2009 |
| CA | 2747226 A1 | 6/2010 |
| CA | 2747227 A1 | 7/2010 |
| CA | 2766332 A1 | 12/2010 |
| CA | 2784941 A1 | 7/2011 |
| CA | 2731085 A1 | 8/2011 |
| CA | 2744437 A1 | 1/2012 |
| CA | 2747506 A1 | 1/2012 |
| CN | 101097815 A | 1/2008 |
| JP | S5854524 A | 3/1983 |
| JP | H08237829 A | 9/1996 |
| JP | H10174216 A | 6/1998 |
| JP | 10334773 A | 12/1998 |
| JP | 2002251932 A | 9/2002 |
| TW | 200820835 A | 5/2008 |
| TW | 200926548 A | 6/2009 |
| WO | 2011086188 A1 | 7/2011 |

* cited by examiner

AUTOMATED GROUNDING DEVICE WITH VISUAL INDICATION

CROSS-REFERENCE TO RELATED APPLICATION

This application claims priority under 35 U.S.C. §119, based on U.S. Provisional Patent Application No. 61/827, 381 filed May 24, 2013, the disclosure of which is hereby incorporated by reference herein.

BACKGROUND OF THE INVENTION

The present invention relates to grounding devices for high voltage electrical switchgear. Generally, utility workers are instructed not to open high voltage switch gear cabinets unless they are sure the circuit is de-energized. This is accomplished via the connectors on the outside of the switch gear. Currently, there are two primary ways of grounding a high voltage connector attached to the dead front of a switch gear apparatus. The first is the use of a 200 Amp grounding elbow that is coupled to ground. The 200 Amp elbow is attached using a hotstick for safety. This elbow only has a 10,000 Amp rating, which could be exceeded by today's high current circuits. The second way to ground the connector is by using a 600 Amp grounding elbow that has a 25,000 Amp rating. However, this 600 Amp grounding elbow cannot be detached by a hotstick.

DETAILED DESCRIPTION OF THE PREFERRED EMBODIMENTS

The following detailed description refers to the accompanying drawings. The same reference numbers in different drawings may identify the same or similar elements.

According to implementations described herein, an automated grounding device is provided for motor-operated switch gear that can be operated at a safe distance. As a visual indication, a viewing window can indicate green (or another color) when contacts in the device are open/ungrounded and yellow (or possible other colors) when contacts in the device are closed/grounded. The device is capable of momentary/fault currents of 25,000 Amps or more, although in some implementations the device may be configured for lower currents, as well. In one implementation, the device uses a clear gel as insulation between contacts to reduce or eliminate the possibility of arcing when the contacts are separated.

Figure 1:
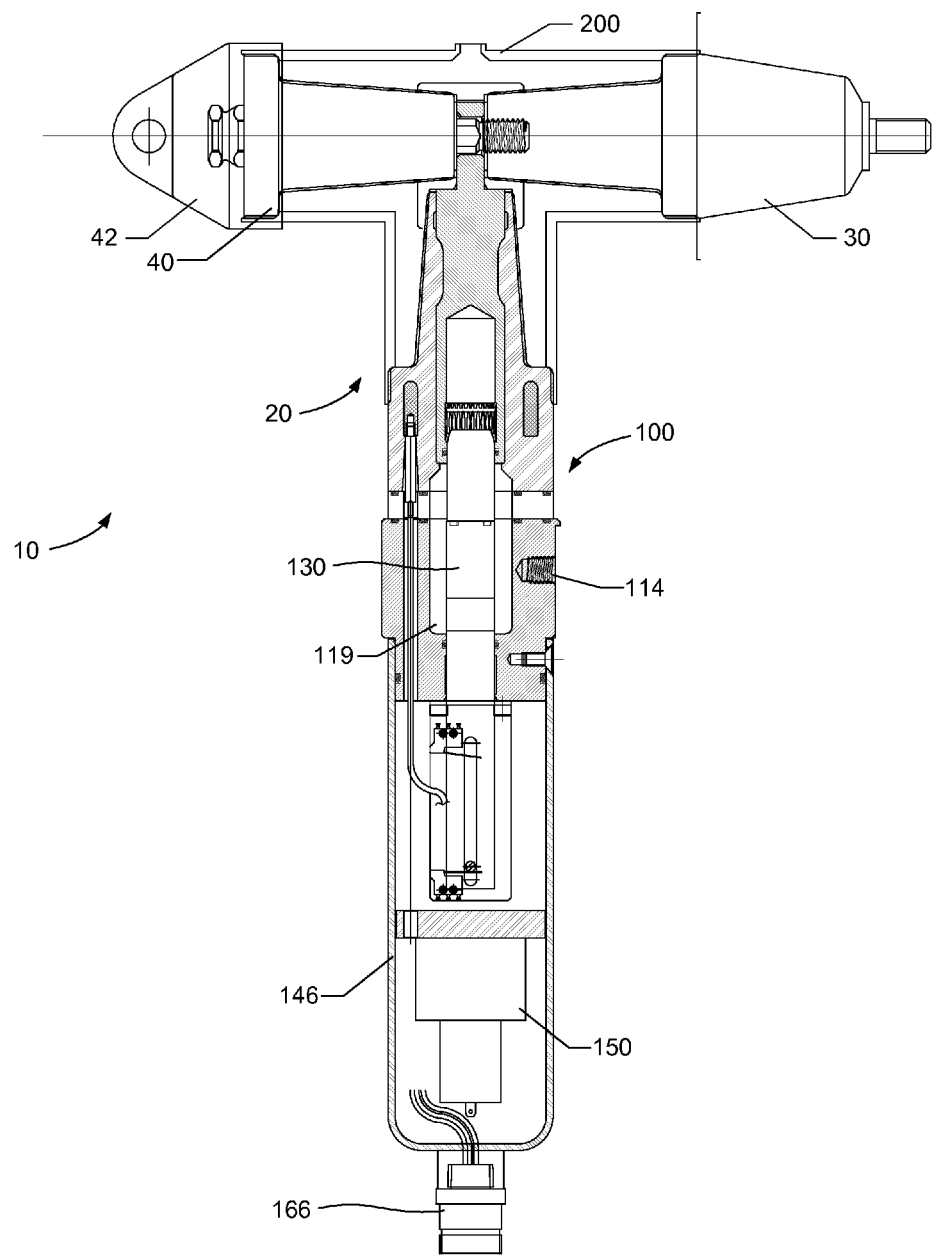
FIG. 1 is a schematic cross-sectional diagram illustrating a side view of an elbow assembly with a grounding device in an open position, consistent with implementations described herein.
Figure 2:
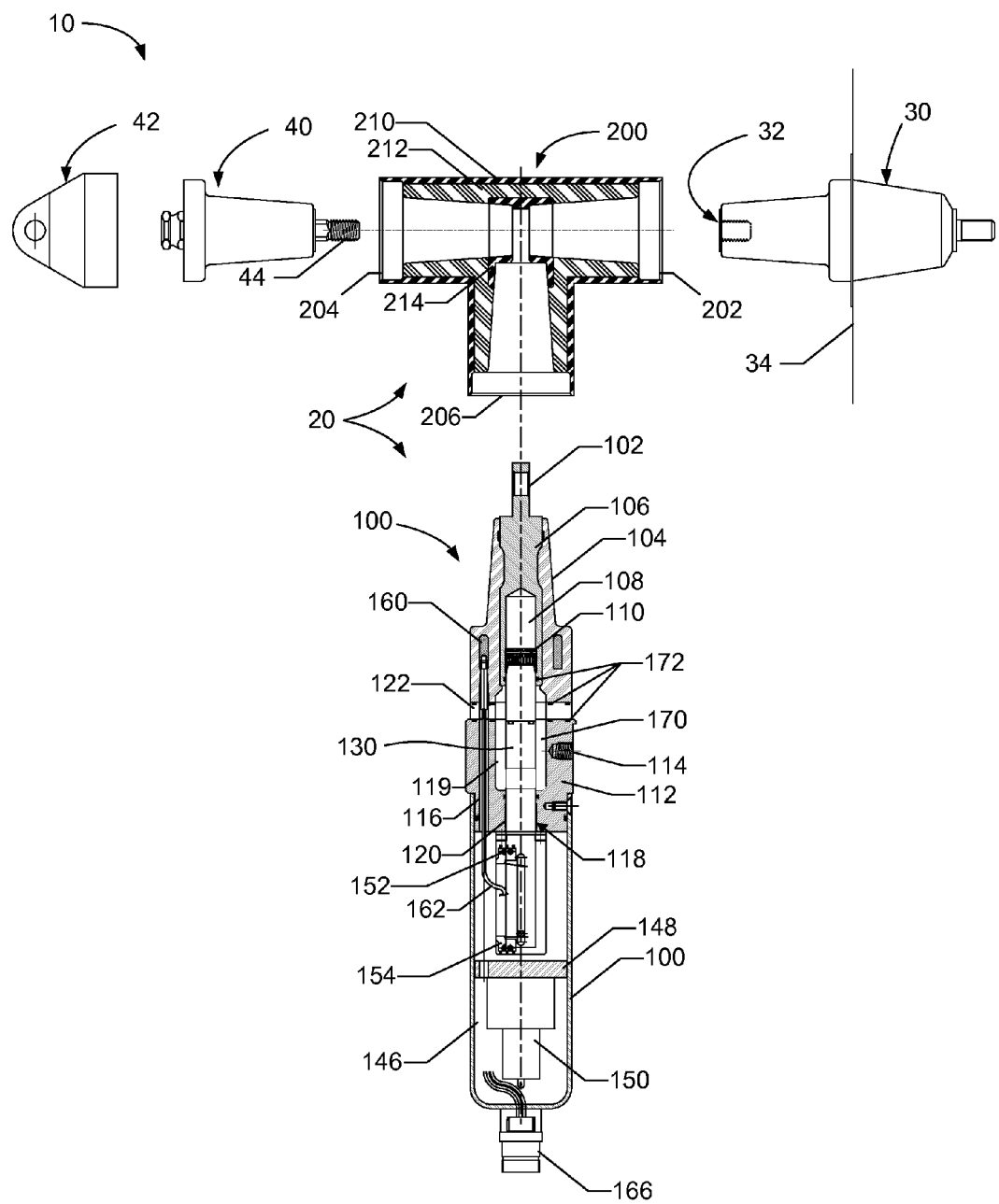
FIG. 2 is an exploded, schematic, partial cross-sectional side view of the elbow assembly of FIG. 1 consistent with implementations described herein.
Figure 3:
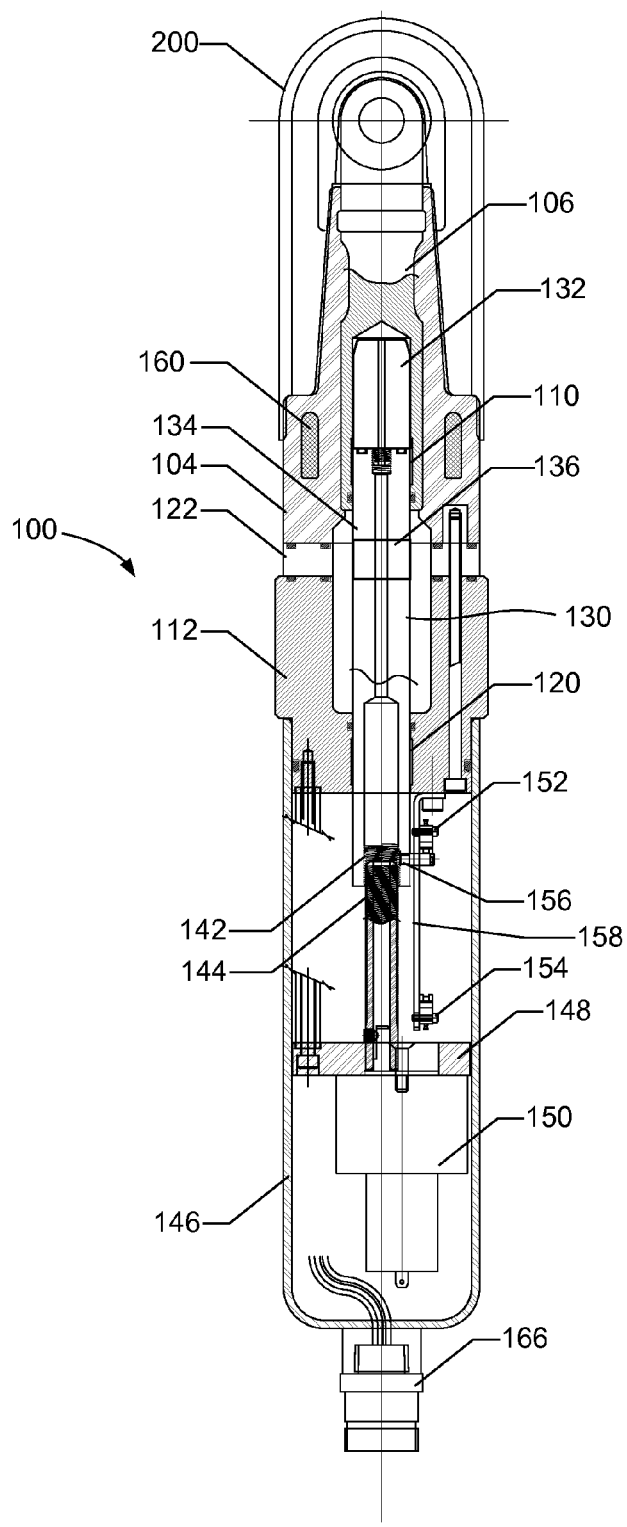
FIG. 3 is a schematic cross-sectional front view of the elbow assembly of FIG. 1 with the grounding device in a closed position.
Figure 4:
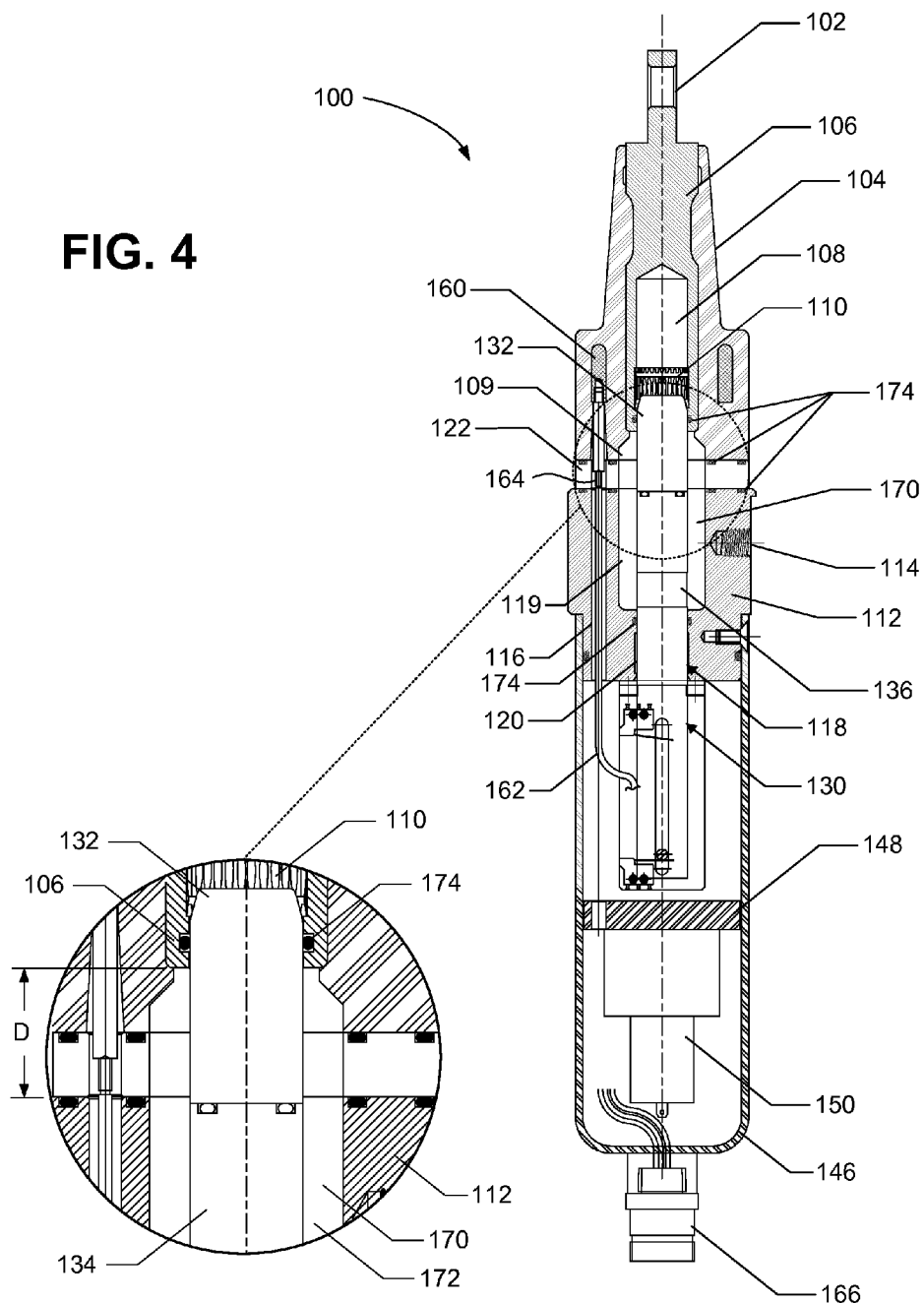
FIG. 4 is an enlarged schematic, partial cross-sectional side view of the device body of the grounding device of FIG. 1.

FIG. 1 is a schematic cross-sectional diagram illustrating a side view of an elbow assembly 10 including a grounding device 20 with a device body 100 in an open position. FIG. 2 is an exploded, schematic, partial cross-sectional side view of elbow assembly 10. FIG. 3 is a schematic cross-sectional front view of elbow assembly 10 with device body 100 in a closed position. FIG. 4 is an enlarged schematic, partial cross-sectional side view of device body 100. Referring collectively to FIGS. 1-4, elbow assembly 10 may include a grounding device 20, a high voltage bushing 30, and an insulating plug 40 with cap 42. Grounding device 20 may include a device body 100 and a "T" connector 200.

Generally, "T" connector 200 may include three female interfaces 202, 204, and 206, as shown in FIG. 2. Interfaces 202 and 204 include openings for receiving a deadbreak transformer bushing or other high or medium voltage terminal, such as an insulating plug, or other power equipment (e.g., a tap, a voltage arrestor, a bushing, etc.). In implementations described herein, interface 202 of "T" connector 200 may be configured to receive high voltage bushing 30, which may be mounted in a piece of electrical equipment such as a transformer or switch. High voltage bushing 30 may include an ANSI standard 600 Amp male interface extending from a face 34 of the electrical equipment. Interface 204 of "T" connector 200 may be configured to receive insulating plug 40 with cap 42. In an exemplary implementation, insulating plug 40 may be a 600 Amp insulating plug. Interface 206 is configured to accept a bushing interface with a spade attached, such as spade connector 102 from grounding device 100. A stud 44 of insulating plug 40 may be inserted through an opening (or bore) of spade 102 and into a female threaded opening 32 of high voltage bushing 30. In other embodiments, stud 44 may be mounted in bushing 30 and received in a threaded opening of insulating plug 40.

"T" connector 200 may include an electrically conductive outer shield 210 formed from, for example, a conductive peroxide-cured synthetic rubber, commonly referred to as EPDM (ethylene-propylene-dienemonomer). Within shield 210, "T" connector 200 may include an insulative inner housing 212, typically molded from an insulative rubber or epoxy material, and a conductive or semi-conductive insert 214 that surrounds a connection portion of interfaces 202-206.

Device body 100 may include a spade connector 102 that extends through a male interface portion 104. Male interface portion 104 may form an insulative outer layer around a bus 106 from which spade connector 102 extends. Male interface portion 104 may be made of, for example, an insulative rubber or epoxy material. Male interface portion 104 may be sized to fit within interface 206 of connector 200. In an exemplary implementation, male interface portion 104 may form a 600 Amp epoxy interface that has a 25,000 Amp momentary current rating. Spade connector 102 and bus 106 may be an integrated component made of an electrically conductive material, such as copper. Bus 106 may include an axial bore 108 formed concentrically therein and a set of louver contacts 110. Bore 108 may be configured to receive a pin assembly 130 such that pin assembly 130 may slide against louver contacts 110, as described further below. As shown in, for example, FIG. 4, bore 108 may open into a larger opening 109 of male interface portion 104.

Device body 100 may further include a conductive housing 112. Conductive housing 112 may be made of an electrically conductive material, such as copper. Conductive housing 112 may include a threaded opening 114. Threaded opening 114 may include a female threaded connection point to receive a terminal and ground wire (not shown). The ground wire terminal may be threaded in to (or otherwise secured at) opening 114 to provide an electrical ground connection for grounding device 20.

Conductive housing 112 may also include a small bore 116 to receive a voltage sensor wire 162 (described further below) and an axial center bore 118. Center bore 118 may be configured to receive pin assembly 130 such that pin assembly 130 may slide against louver contacts 120, as described further below. As shown in, for example, FIGS. 1 and 2, center bore 118 may join a larger opening 119 of conductive housing 112.

In implementations described herein, a viewing lens 122 is interposed between male interface portion 104 and conductive housing 112. In one implementation, viewing lens 122 may be formed of a transparent or substantially transparent insulating material, such as glass, plastic (e.g., Lexan™), etc. Viewing lens 122 may be a substantially annular disc with an outside diameter generally equal to that of an adjacent end of male interface portion 104 and with an inside diameter generally the same as that of openings 109 and 119.

In some implementations, viewing lens 122 may be configured to provide near 360 degree visibility (e.g., about a central axis of device body 100), with the exception of studs (not shown) to secure male interface portion 104, viewing lens 122, and conductive housing 112 together. In another implementation, viewing lens 122 may be provided in only a portion of device body 100 (e.g., as a cylindrical or rectangular window or port through device body 100).

Pin assembly 130 may include a green-colored non-conductive (e.g., insulative) tip 132, a conductive pin 134, and a yellow-colored indicator band 136. Particular colors described herein are used for illustrative purposes and are not intended to be limiting. In one implementation, non-conductive tip 132 may be formed from a plastic material, and conductive pin 134 may be formed from copper. Indicator band 136 may be a conductive or non-conductive material that adheres to, or is mechanically secured to, conductive pin 134. In one implementation, indicator band 136 may be painted onto the surface of conductive pin 134.

Figure 5:
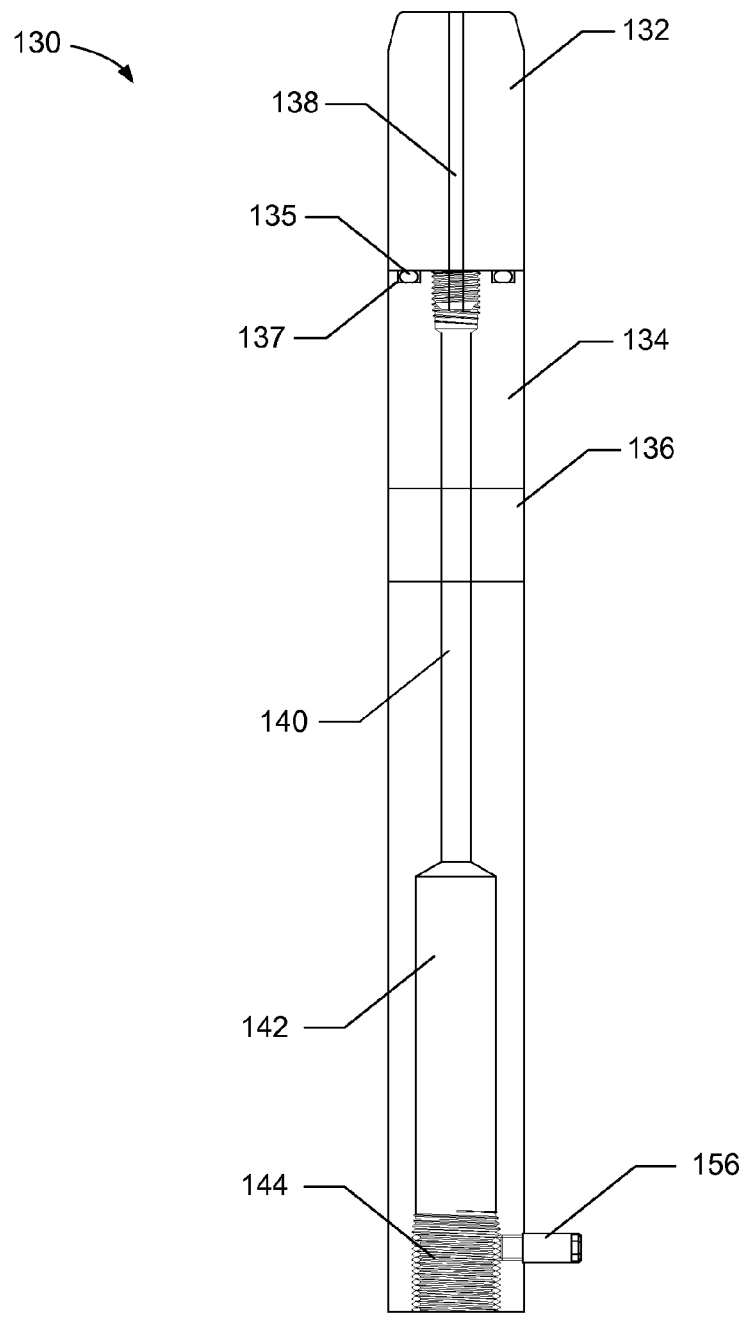
FIG. 5 is a simplified cross-sectional front view of a pin assembly of the grounding device of FIG. 1.

FIG. 5 provides an enlarged view of pin assembly 130. Referring collectively to FIGS. 1-5, non-conductive tip 132 may include a threaded stud and conductive pin 134 may include a corresponding threaded female opening (or vice-versa) to secure non-conductive tip 132 to conductive pin 134. A channel 138 in non-conductive tip 132 may align with a channel 140 in conductive pin 134 to allow air to escape from bore 108 during advancement of pin assembly 130 into bore 108. Conductive pin 134 may also include a seat 135 for O-rings 137 to seal the interface between non-conductive tip 132 and conductive pin 134. At an opposite end from conductive pin 134, channel 140 may join a partially-threaded opening 142. Partially-threaded opening 142 may be configured to receive a male drive screw 144.

Conductive housing 112 may be secured to a rigid cover 146. Cover 146 may enclose a portion of pin assembly 130, male drive screw 144, a motor mounting plate 148, a motor 150, micro-switches 152/154, a stabilizing pin 156, and a track 158. Cover 146 may be formed from, for example, stainless steel. Motor mounting plate 148 may provide a mounting support for motor 150. Motor 150 may include, for example, a DC gear motor for moving pin assembly 130 into different positions to open and close grounding device 20. Motor 150 may engage male drive screw 144 to move pin assembly 130 axially within bores 108/118 and openings 109/119.

The distance of travel for pin assembly 130/drive screw 144 may be governed by micro-switches 152/154 and stabilizing pin 156. Stabilizing pin 156 may be secured to a lower portion of pin assembly 130 to prevent rotation of pin assembly 130 when male drive screw 144 moves pin assembly 130. Stabilizing pin 156 may move along track 158 between upper micro-switch 152 and lower micro-switch 154. Micro-switches 152/154 may provide signals to motor 150 and/or a controller (e.g., control unit 50 shown in FIGS. 6 and 7). When contacted by stabilizing pin 156, upper micro-switch 152 may indicate a closed/grounded position for grounding device 20. When contacted by stabilizing pin 156, lower micro-switch 154 may indicate an open/ungrounded position for grounding device 20. In one implementation, pin assembly 130 is configured to provide approximately two inches (e.g., ±an eighth inch) of axial distance ("D" in FIG. 4) between bus 106 and conductive pin 134 when grounding device 20 is in an open/ungrounded position. Thus, the distance between micro-switches 152/154 may be between about two and three inches to ensure good contact between conductive pin 134 and louver 110 when grounding device 20 is in a closed/grounded position. In other implementations, the minimum axial distance, D, may be determined based on a type of dielectric insulator used in device body 100 (as described further below).

Device body 100 may also include a voltage sensor 160, a voltage sensor wire 162, and a sensor wire connector 164. Voltage sensor 160 may include, for example, a capacitive voltage sensor coupled to sensor wire 162 by connector 164. The output of voltage sensor 160 may be passed through voltage sensor wire 162 to a communications receptacle 166 and eventually a control (e.g., control unit 50) located outside device body 100.

Opening 109, opening 119, and the inside opening of viewing lens 122 together may form a chamber 170 inside device body 100. Chamber 170 may be filled with a dielectric insulator. Typical dielectric insulators may include air, sulfur hexafluoride ($SF_6$), other gasses, or oil. According to an implementation described herein, chamber 170 may be filled with a solid or semi-solid dielectric material. Particularly, a clear silicone gel 172 may serve as the dielectric insulating material. Several O-rings 174 may be used to seal silicone gel 172 within chamber 170 and to provide a watertight enclosure. More particularly, O-rings 174 may be included adjacent pin assembly 130 near an entrance to bore 108 and near an entrance to bore 118. Additional O-rings 174 may be included at an interface between male interface portion 104 and viewing lens 122 and at an interface between lens 122 and conductive housing 112.

Silicone gel 172 in chamber 170 may be used as an insulation medium between bus 106/louver contacts 110 and pin assembly 130 along non-conductive tip 132. In one implementation, silicone gel 172 is generally translucent or transparent to permit outside visibility of either green-colored non-conductive tip 132 or yellow-colored indicator band 136 through chamber 170 and viewing lens 122. Silicone gel 172 may also be self-healing, in that silicone gel 172 may re-adhere to a surface of pin assembly 130 as portions of pin assembly 130 slide past O-rings 174 and into chamber 170.

Silicone gel 172 can hold off the voltage from arcing across a surface of non-conductive tip 132 (e.g., over distance, D, shown in FIG. 4) and going to ground. Furthermore, silicone gel 172 allows conductive pin 134 and non-conductive tip 132 to move in and out of bore 108 in order to alternately make contact with bus 106/louver contacts 110. When conductive pin 134 is in contact with bus 106/louver contacts 110 grounding device 10 may be in a closed/grounded condition. When non-conductive tip 132 is in contact with bus 106/louver contacts 110, non-conductive tip 132 and the silicone gel can separate conductive pin 134 from bus 106 to eliminate arcing to ground. In configurations described herein for 25,000 Amp interfaces, use of silicone gel as a dielectric insulator enables use of a relatively small distance, D, between conductive pin 134 and bus 106, when pin assembly 130 is in the open, ungrounded position. For example, distance D may generally be less than three inches and, more particularly, about two inches. By contrast, the distance required for using air as an insulating medium under similar conditions would exceed 10 inches.

Figure 6:
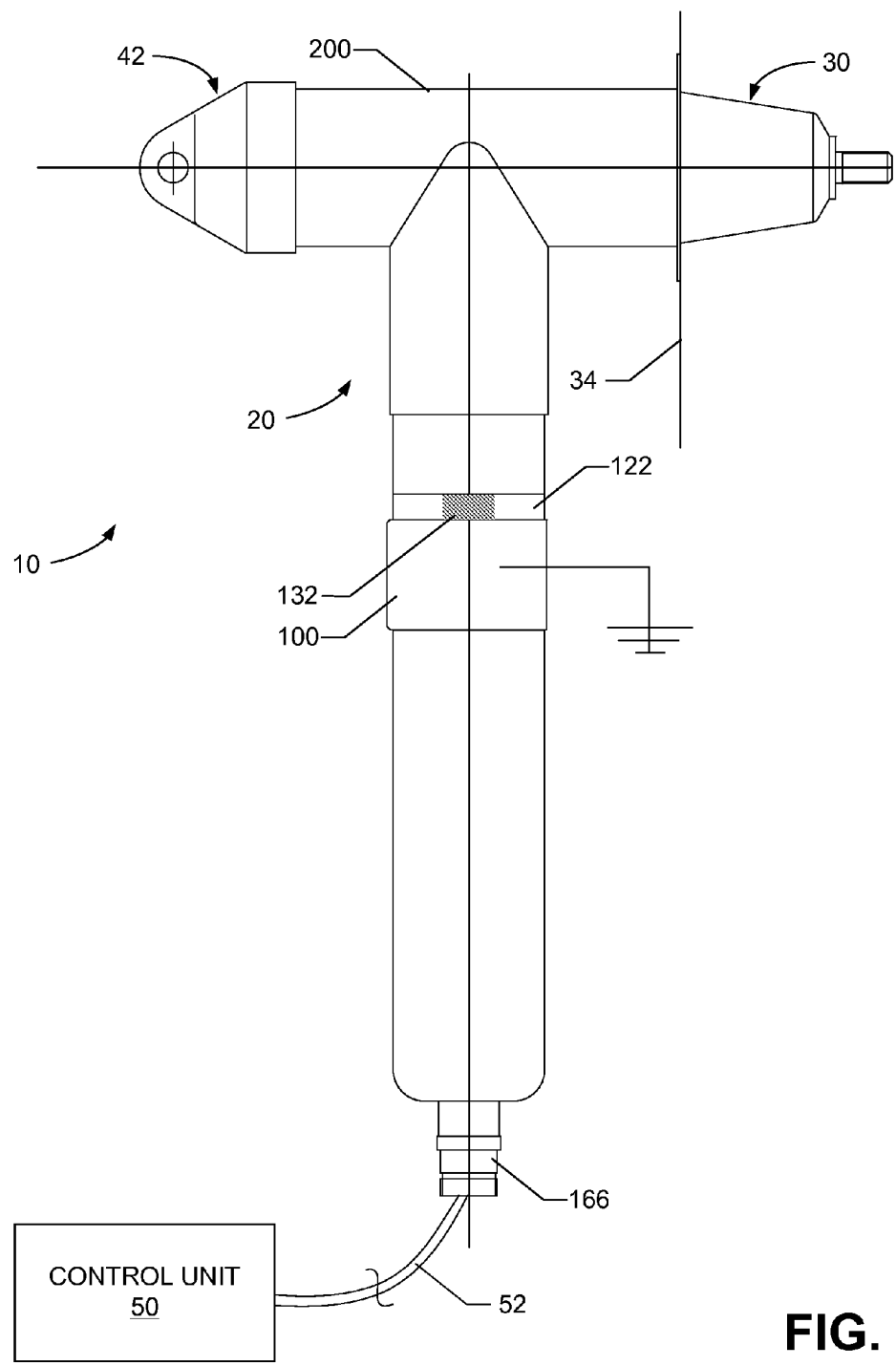
FIG. 6 is a side view of the elbow assembly of FIG. 1 according to one implementation.

FIG. 6 is a side view of elbow assembly 10 according to one implementation. As shown in FIG. 6, control unit 50 is connected to grounding device 20 via communications receptacle 166 and a cable 52. Control unit 50 may include, for example, a multi-purpose control unit. Control unit 50 may be configured to monitor voltage reading from voltage sensor 160 and instruct motor 150 to drive pin assembly 130. In one implementation, control unit 50 may combine control functions for other equipment associated with elbow assembly 10.

In the implementation of FIG. 6, grounding device 20 is mounted directly to electrical equipment that includes high voltage bushing 30. Insulated plug 40 (not visible in FIG. 6) with cap 42 may be threaded into high voltage bushing 30 to clamp elbow assembly 10 to high voltage bushing 30. In the particular position of FIG. 6, green-colored non-conductive tip 132 may be visible through viewing lens 122, indicating that grounding device 20 is open and not grounded.

Referring to FIGS. 1-6, in operation, to open the circuit associated with grounding device 10 motor 150 drives pin assembly 130 backward (e.g., downward) until stabilizing pin 156 contacts lower micro-switch 154. In this position, non-conductive tip 132 is positioned against louver contacts 110 to prevent a circuit between copper bus 106 and the grounded terminal at threaded opening 114. Movement of pin assembly 130 into this open/ungrounded orientation positions green-colored non-conductive tip within the inside opening of viewing lens 122. The green color is visible through viewing lens 122, providing a visual indication that grounding device 10 is open and ungrounded.

To close and ground a circuit associated with elbow assembly 10, control unit 50 verifies that the circuit is de-energized by sensing whether voltage is present through capacitive voltage sensor 160. If no voltage is present, motor 150 drives pin assembly 130 forward (e.g., upward) until stabilizing pin 156 contacts upper micro-switch 152. In this position, electrical connection is provided from copper bus 106 through louver contacts 110, conductive pin 134, louver contacts 120, and conductive housing 112 to the grounded terminal at threaded opening 114, thereby creating a complete circuit and grounding elbow assembly 10. Movement of pin assembly 130 into this closed/grounded orientation positions yellow-colored indicator band 136 within the inside opening of viewing lens 122. The yellow color is visible through viewing lens 122, providing a visual indication that grounding device 10 is closed and grounded.

Figure 7:
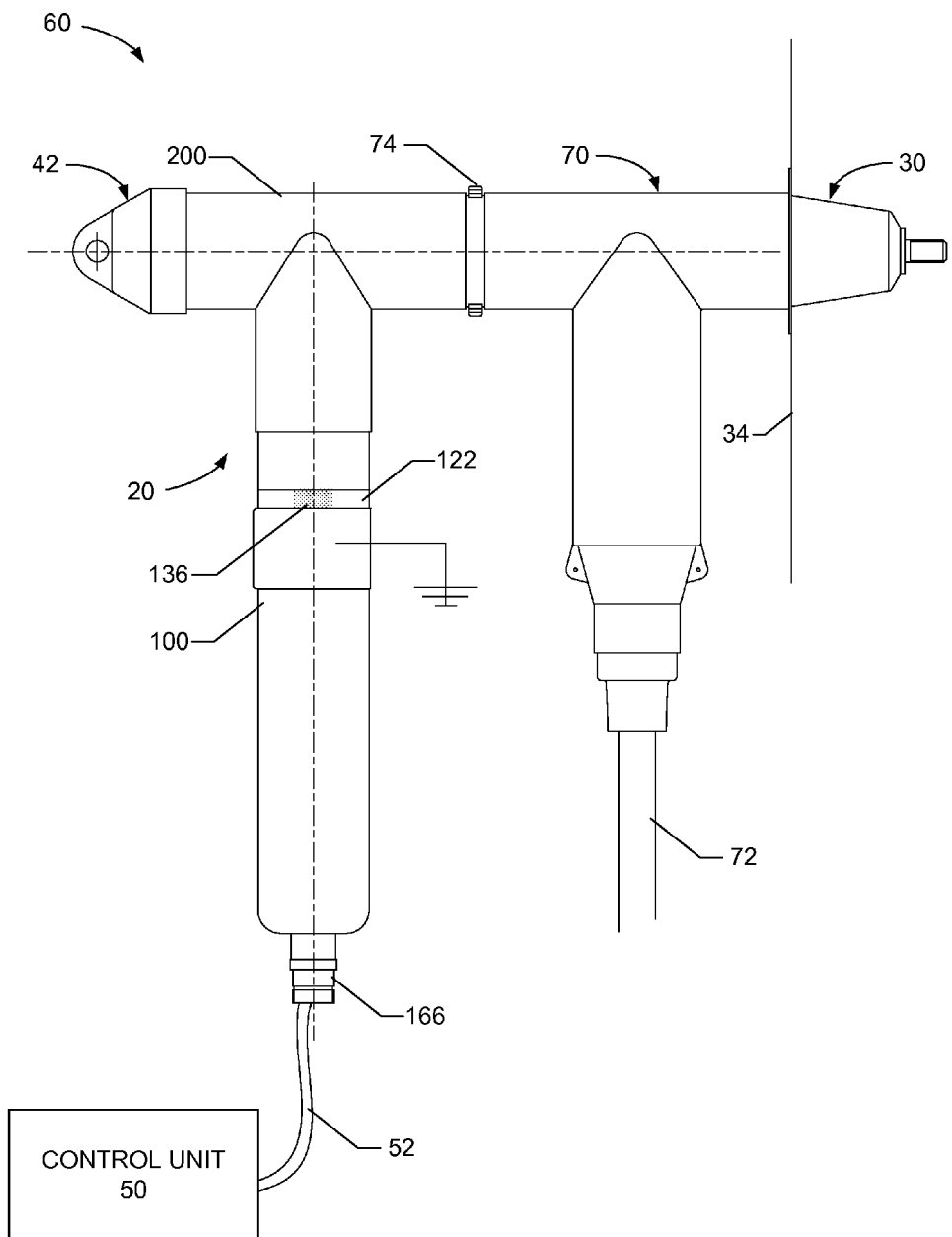
FIG. 7 is a side view of the elbow assembly of FIG. 1 according to another implementation.

FIG. 7 is a side view of an elbow assembly 60 according to another implementation. Referring to FIG. 7, grounding device 20 is mounted to a standard elbow 70 that is mounted to electrical equipment that includes high voltage bushing 30. Elbow 70 may include, for example, a standard "T" body elbow connecting a power cable 72 to high voltage bushing 30. A connector plug 74 is used to connect elbow 70 to "T" connector 200 of grounding device 20. In the particular position of FIG. 7, yellow-colored indicator band 136 may be visible through viewing lens 122, indicating that grounding device 20 is closed and grounded.

In implementations described herein a grounding device for switchgear may include a "T" connector and a device body. In one implementation, the body may include (1) a male interface portion including an electrically conductive bus with a first bore and a spade connector; (2) a conductive housing including a second bore that is axially aligned with the first bore, and a grounding terminal to receive a grounding wire; (3) a pin assembly including a non-conductive tip, and a conductive pin, wherein the pin assembly is configured to move axially within the first and second bores between a closed position that provides an electrical connection between the bus and the conductive housing and an open position that provides no electrical connection; (4) a communications receptacle to receive signals from a controller outside the device body; and (5) a motor configured to selectively drive the pin assembly between the open position and the closed position, based on a signal from the controller. The "T" connector may be configured to receive the male interface, a bushing for a piece of electrical equipment, and an insulating plug.

The above-described grounding device provides an effective means for connecting and activating a grounding device for high voltage switch gear. In other implementations, other low, medium, or high voltage power components may be configured to include the grounding devices described herein.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments. For example, implementations described herein may also be used in conjunction with other devices, such as medium or low voltage equipment.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. A grounding device, comprising:
   a device body including:
      a male interface portion including a bus having a first bore and a spade connector;
      a conductive housing including:
         a second bore that is axially aligned with the first bore, and an opening for a grounding terminal to receive a grounding wire;

a pin assembly including:
  a non-conductive tip, and
  a conductive pin, wherein the pin assembly is configured to move axially within the first and second bores between a closed position that provides an electrical connection between the bus and the conductive housing and an open position that provides no electrical connection between the bus and the conductive housing;

an internal chamber around a portion of the pin assembly and formed within the male interface portion and the conductive housing, wherein a solid or semi-solid dielectric insulating material is sealed within the internal chamber to prevent voltage arcing when the pin assembly is in the open position; and a motor configured to selectively drive the pin assembly between the open position and the closed position, based on a signal from a controller, and a device connector including:
  a first connector end configured to receive the male interface portion; and
  a second connector end configured to receive a bushing for a piece of electrical equipment.

2. The grounding device of claim 1, wherein the grounding device is configured for a 25,000 Amp momentary current rating.

3. The grounding device of claim 1, wherein the device body further comprises a voltage sensor in communication with the controller, and wherein the controller does not provide a signal to drive the pin assembly from the open position to the closed position unless the voltage sensor indicates that no voltage is present.

4. The grounding device of claim 1, wherein the device body further comprises a micro-switch to govern a travel distance that the motor drives the pin assembly.

5. The grounding device of claim 1, wherein the controller is located outside the device body, and wherein the device body further comprises a communication receptacle to provide signals from the controller to the motor.

6. The grounding device of claim 1, wherein the device body further comprises a viewing lens to display a portion of the pin assembly; and
  wherein the non-conductive tip of the pin assembly is color-coded with a first color to indicate the open position, and the conductive pin includes a color-coded band of a second color to indicate the closed position.

7. The grounding device of claim 6, wherein the viewing lens is installed between the male interface portion and the conductive housing to display a portion of the pin assembly as the pin assembly moves axially past the viewing lens.

8. The grounding device of claim 6, wherein the solid or semi-solid dielectric insulating material permits outside visibility of the first color or the second color through the viewing lens.

9. The grounding device of claim 8, wherein the dielectric insulating material includes a silicone gel.

10. The grounding device of claim 8, wherein the grounding device is configured for a 25,000 Amp momentary current rating, and wherein a distance between the conductive pin and the bus, when the pin assembly is in the open position, is less than 3 inches.

11. The grounding device of claim 1, wherein the second connector end is formed with an axial direction substantially perpendicular to an axial direction of the first connector end;

wherein the device connector further comprises a third connector end formed substantially in line with the axial direction of the second connector end and configured to receive an insulating plug;

wherein the spade connector includes a third bore therethrough;

wherein the bushing includes a female threaded opening;

wherein the insulating plug includes a threaded stud; and wherein the device connector is configured to align the third bore, the female threaded opening, and the threaded stud along the axial direction of the second connector end.

12. A grounding device body, comprising:
a male interface portion including an electrically conductive bus with a first bore open to one end and a spade connector on an opposite end;

a conductive housing including:
  a second bore that is axially aligned with the first bore, and
  an opening for a grounding terminal to receive a grounding wire;

a pin assembly including:
  a non-conductive tip, and
  a conductive pin, wherein the pin assembly is configured to move axially within the first and second bores between a closed position that provides an electrical connection between the bus and the conductive housing and an open position that provides no electrical connection between the bus and the conductive housing;

an internal chamber around a portion of the pin assembly and formed within the male interface portion and the conductive housing, wherein a solid or semi-solid dielectric insulating material is sealed within the internal chamber to prevent voltage arcing when the pin assembly is in the open position;

a communications receptacle to receive signals from a controller outside the device body; and a motor configured to selectively drive the pin assembly between the open position and the closed position, based on a signal from the controller.

13. The grounding device of claim 12, further comprising:
a first micro-switch to signal to the controller when the pin assembly is in an open position; and
a second micro-switch to signal to the controller when the pin assembly is in a closed position.

14. The grounding device of claim 12, further comprising:
a viewing lens to display a portion of the pin assembly that is positioned in view of the viewing lens,
wherein the non-conductive tip includes a first color that is visible through the viewing lens when the pin assembly is in the open position, and
wherein the conductive pin includes a second color that is visible through the viewing lens when the pin assembly is in the closed position.

15. The grounding device of claim 14,
wherein the dielectric insulating material permits outside visibility of the first color or the second color through the viewing lens.

16. The grounding device of claim 12, wherein the grounding device is configured for a 25,000 Amp momentary current rating, and wherein a distance between the conductive pin and the bus, when the pin assembly is in the open position, is approximately two inches.

17. The grounding device of claim 15, wherein the dielectric insulating material includes a silicone gel.

18. The grounding device of claim 12, wherein the male interface portion is configured to be received within a female opening of an elbow connector.

19. The grounding device of claim 12, wherein the device body further comprises a voltage sensor in communication with the controller.

20. The grounding device of claim 12, wherein the solid or semi-solid silicone material adheres to a surface of the pin assembly within the internal chamber to inhibit voltage arcing across a surface of the non-conductive tip when the pin assembly is in the open position.

* * * * *